(12) United States Patent
Chen et al.

(10) Patent No.: US 10,855,072 B2
(45) Date of Patent: Dec. 1, 2020

(54) INTELLIGENT SAFETY RELAY AND CIRCUIT APPLIED THEREBY

(71) Applicants: SHANGHAI CHENZHU INSTRUMENT CO., LTD., Shanghai (CN); SHANGHAI CHENZHU SAFETY TECHNOLOGY CO., LTD., Shanghai (CN)

(72) Inventors: Xiaoquan Chen, Shanghai (CN); Ting Zhou, Shanghai (CN); Xinglei Li, Shanghai (CN); Guangyong Song, Shanghai (CN); Yunli Qin, Shanghai (CN)

(73) Assignees: SHANGHAI CHENZHU INSTRUMENT CO., LTD., Shanghai (CN); SHANGHAI CHENZHU SAFETY TECHNOLOGY CO., LTD., Shanghai (CN)

( * ) Notice: Subject to any disclaimer, the term of this patent is extended or adjusted under 35 U.S.C. 154(b) by 0 days.

(21) Appl. No.: 16/490,101

(22) PCT Filed: Dec. 5, 2018

(86) PCT No.: PCT/CN2018/119405
§ 371 (c)(1),
(2) Date: Aug. 30, 2019

(87) PCT Pub. No.: WO2019/128662
PCT Pub. Date: Jul. 4, 2019

(65) Prior Publication Data
US 2020/0321774 A1  Oct. 8, 2020

(30) Foreign Application Priority Data

Dec. 27, 2017 (CN) .......................... 2017 1 1440207
Dec. 27, 2017 (CN) ..................... 2017 2 1858936 U

(51) Int. Cl.
H02H 7/00 (2006.01)
H02H 7/20 (2006.01)
(Continued)

(52) U.S. Cl.
CPC ............ *H02H 7/20* (2013.01); *H02H 1/0007* (2013.01); *H02H 1/0092* (2013.01); *H03K 17/60* (2013.01); *H03K 17/687* (2013.01); *H03K 19/20* (2013.01)

(58) Field of Classification Search
None
See application file for complete search history.

(56) References Cited

U.S. PATENT DOCUMENTS 5,608,657 A * 3/1997 Conway ............. G05B 23/0205
                                                    700/79
10,714,974 B2 * 7/2020 Clifton ...................... H02J 3/32
(Continued)

FOREIGN PATENT DOCUMENTS

CN         101272048 A       9/2008

OTHER PUBLICATIONS

Written Opinion PCT/CN2018/119405 Mar. 1, 2019.

*Primary Examiner* — Stephen W Jackson
(74) *Attorney, Agent, or Firm* — Sughrue Mion, PLLC

(57) ABSTRACT

Disclosed are an intelligent safety relay and a circuit applied thereby. The intelligent safety relay includes: a first processing chip MCU A, a second processing chip MCU B, first and second input driving circuits, first to third input sampling circuits, first and second diagnostic signal generation circuits, first and second logic circuits, a diagnostic signal detection circuit, first and second relay driving circuits, and first and second relay circuits. The first processing chip MCU A and the second processing chip MCU B can automatically control, based on samples of the input driving (Continued)

circuits taken by the input sampling circuits, connection or disconnection of contacts in the first and second relay circuits so as to switch on or off an output.

13 Claims, 4 Drawing Sheets

(51) Int. Cl.
  *H03K 17/687* (2006.01)
  *H02H 1/00* (2006.01)
  *H03K 19/20* (2006.01)
  *H03K 17/60* (2006.01)

(56) References Cited

U.S. PATENT DOCUMENTS

2012/0174804 A1* 7/2012 Rong .................... F15B 20/001
  100/347
2020/0091706 A1* 3/2020 Yang ...................... G01R 31/50

\* cited by examiner

INTELLIGENT SAFETY RELAY AND CIRCUIT APPLIED THEREBY

CROSS REFERENCES TO RELATED APPLICATIONS

This is a Sect. 371 National Stage application of a PCT International Application No. PCT/CN2018/119405, filed on Dec. 5, 2018, which claims priority of a Chinese Patent Application No. 2017114402070, filed on Dec. 27, 2017, and Chinese Patent Application No. 2017218589363, filed on Dec. 27, 2017, the contents of these applications are hereby incorporated by reference in their entireties for all purposes.

BACKGROUND OF THE PRESENT DISCLOSURE

Field of Disclosure

This disclosure relates to the technical field of relay, and in particular, to an intelligent safety relay and circuit applied thereby.

Description of Related Arts

A safety relay is a safety control element, which is applied to a safety loop and receives signals of safety elements, such as an emergency stop switch, a safety light curtain, a double-handed switch, and a safety carpet. When these elements transmit a danger signal to the safety relay, the safety relay cut of a power source reliably, to ensure safety.

SUMMARY OF THE PRESENT DISCLOSURE

This disclosure provides an intelligent safety relay and a circuit applied thereby.

In order to accomplish the foregoing objective and other related objectives, this disclosure provides an intelligent safety relay, comprising: a first processing chip MCU A, a second processing chip MCU B, a first input driving circuit, a second input driving circuit, a first input sampling circuit, a second input sampling circuit, a third input sampling circuit, a first diagnostic signal generation circuit, a second diagnostic signal generation circuit, a diagnostic signal detection circuit, a first logic circuit, and a second logic circuit, a first relay driving circuit, a second relay driving circuit, a first relay circuit, and a second relay circuit.

The first processing chip MCU A comprises: first to tenth pins. The second processing chip MCU B comprises: eleventh to twentieth pins. The first input driving circuit has an input end connected to the first pin of the first processing chip MCU A and an output end that leads out a first control end S11. The second input driving circuit has an input end connected to the eleventh pin of the second processing chip MCU B, and an output end that leads out a second control end S21. The first control end S11 and the second control end S21 output a first driving signal and a second driving signal respectively, and the first driving signal and the second driving signal are periodic pulse signals having different waveforms.

The first input sampling circuit has an input end connected to a first sampling end S12 and an output end that is connected to the second pin of the first processing chip MCU A and the twelfth pin of the second processing chip MCU B. The second input sampling circuit has an input end connected to a second sampling end S22 and an output end that is connected to the third pin of the first processing chip MCU A and the thirteenth pin of the second processing chip MCU B. The third input sampling circuit has an input end connected to a second sampling end S34 and an output end that is connected to the fourth pin of the first processing chip MCU A and the fourteenth pin of the second processing chip MCU B. Some of the first sampling end S12, the second sampling end S22, and the third sampling end S34 are coupled to S11 and the rest is coupled to the S21, so as to sample signals.

When information is sampled, a sampling signal recognizable to the first processing chip MCU A is generated and inputted to the first processing chip MCU A, and a sampling signal recognizable to the second processing chip MCU B is generated and inputted to the second processing chip MCU B, so that the first processing chip MCU A and the second processing chip MCU B, when receiving the sampling signal, control the intelligent safety relay to stay in an output ready state. The fifth pin of the first processing chip MCU A is connected to the fifteenth pin of the second processing chip MCU B to form a first data channel, the fifth pin is a data transmitting end, and the fifteenth pin is a data receiving end. The sixth pin of the first processing chip MCU A is connected to the sixteenth pin of the second processing chip MCU B to form a second data channel, the sixth pin is a data receiving end, and the sixteenth pin is a data transmitting end. Data transmission or clock synchronization is performed between the first processing chip MCU A and the second processing chip MCU B through the first data channel and the second data channel. The seventh pin of the first processing chip MCU A is connected to an input end of the first diagnostic signal generation circuit. The seventeenth pin of the second processing chip MCU B is connected to an input end of the second diagnostic signal generation circuit.

The diagnostic signal detection circuit has a first output end connected to the eighth pin of the first processing chip MCU A, a second output end connected to the eighteenth pin of the second processing chip MCU B, and an input end. The first logic circuit has a first input end connected to the ninth pin of the first processing chip MCU A, a second input end connected to the tenth pin of the first processing chip MCU A, and an output end connected to an input end of a first relay driving circuit. An output end of the first relay driving circuit is connected to a first relay coil of the first relay circuit. The first relay circuit further comprises: a first normally closed contact NC connected to an output end of the first diagnostic signal generation circuit, a first normally open contact NO connected to a first relay output end, and a first common contact G connected to the input end of the diagnostic signal detection circuit.

The first logic circuit is configured to perform a logical operation according to input signals at the ninth pin and the tenth pin of the first processing chip MCU A, to obtain a first on-off control signal to cause the first relay driving circuit to drive the first relay coil to be powered on or powered off, so that the first common contact G is electrically connected to the first normally closed contact NC or the first normally open contact NO. The second logic circuit has a first input end connected to the nineteenth pin of the second processing chip MCU B, a second input end connected to the twentieth pin of the second processing chip MCU B, and an output end connected to an input end of the second relay driving circuit 14.

An output end of the second relay driving circuit is connected to a second relay coil of the second relay circuit. The second relay circuit further comprises: a second normally closed contact NC connected to an output end of the second diagnostic signal generation circuit, a second normally open contact NO connected to a second relay output end, and a second common contact G that is connected to the input end of the diagnostic signal detection circuit and the first common contact G. The second logic circuit is configured to perform a logical operation according to input signals at the nineteenth pin and the twentieth pin of the second processing chip MCU B, to obtain a second on-off control signal to cause the second relay driving circuit to drive the second relay coil to be powered on or powered off, so that the second common contact G is electrically connected to the second normally closed contact NC or the second normally open contact NO.

The electric connection between the first common contact G and the first normally open contact NO and the electric connection between the second common contact G and the second normally open contact NO cause the first relay output end to be in conduction with the second relay output end.

In an embodiment of this disclosure, the first logic circuit comprises: a first AND gate comprising a first input end, a second input end, and an output end; and a first watchdog circuit. The first input end of the first AND gate is connected to the ninth pin of the first processing chip MCU A, the tenth pin of the first processing chip MCU A is connected to an input end of the first watchdog circuit, an output end of the first watchdog circuit is connected to the second input end of the first AND gate, and the output end of the first AND gate is connected to the input end of the first relay driving circuit. The second logic circuit comprises: a second AND gate comprising a first input end, a second input end, and an output end; and a second watchdog circuit. The first input end of the second AND gate is connected to the nineteenth pin of the second processing chip MCU B, the twentieth pin of the second processing chip MCU B is connected to an input end of the second watchdog circuit, an output end of the second watchdog circuit is connected to the second input end of the second AND gate, and the output end of the first AND gate is connected to the input end of the first relay driving circuit.

In an embodiment of this disclosure, the first processing chip MCU A is configured to periodically output, through the tenth pin thereof, a pulse signal to the first watchdog circuit. The first watchdog circuit is configured to output a low-level signal in a case that the pulse signal is not received within a predetermined time period, so that the output end of the first AND gate outputs a low-level signal, the first relay driving circuit outputs a low level, the first relay coil is powered off, and therefore the first common contact G of a first switch is disconnected from the first normally open contact NO. The second processing chip MCU B is configured to periodically output, through the twentieth pin thereof, a pulse signal to the second watchdog circuit. The second watchdog circuit is configured to output a low-level signal in a case that the pulse signal is not received within a predetermined time period, so that the output end of the second AND gate outputs a low-level signal, the second relay driving circuit outputs a low level, and the second relay coil is powered off, and therefore the second common contact G of a second switch is disconnected from the second normally open contact NO.

In an embodiment of this disclosure, the input driving circuits are implemented by using transistors, high side switches, or MOS transistors.

In an embodiment of this disclosure, the input driving circuits are implemented by using transistors. The first input driving circuit and the second input driving circuit have the same circuit structure, and the circuit structure comprises: a first PNP-type transistor, a first NPN-type transistor, a first resistor, a second resistor, a third resistor, and a fourth resistor. An emitter of the first PNP-type transistor is connected to a power supply, a base of the first PNP-type transistor is connected to a collector of the first NPN-type transistor through the first resistor, and a collector of the first PNP-type transistor is grounded through the second resistor. The collector of the first NPN-type transistor is grounded, a base of the first NPN-type transistor is connected to one end of the third resistor and one end of the fourth resistor, and the other end of the third resistor is grounded. When the circuit structure is applied to the first input driving circuit, the collector of the first PNP-type transistor is led out to the first control end S11, and the other end of the fourth resistor is connected to the first pin of the first processing chip MCU A. When the circuit structure is applied to the second input driving circuit, the collector of the first PNP-type transistor is led out to the second control end S21, and the other end of the fourth resistor is connected to the eleventh pin of the second processing chip MCU B.

In an embodiment of this disclosure, the first input sampling circuit, the second input sampling circuit, and the third input sampling circuit are each implemented by means of resistive subdivision or a logic control element, and the logic control element comprises: an operational amplifier or an inverter.

In an embodiment of this disclosure, the first input sampling circuit, the second input sampling circuit, and the third input sampling circuit have the same circuit structure, and the circuit structure comprises: an inverter, a first voltage regulator tube, a fifth resistor, a sixth resistor, and a seventh resistor. One end of the fifth resistor is connected to one end of the sixth resistor and one end of the seventh resistor, the other end of the sixth resistor is grounded, the other end of the seventh resistor is connected to a negative electrode of the first voltage regulator tube and an input end of the inverter, and a positive electrode of the first voltage regulator tube is grounded. When the circuit structure is applied to the first input sampling circuit, the other end of the fifth resistor is connected to the first sampling end, and an output end of the inverter is connected to the second pin of the first processing chip MCU A and the twelfth pin of the second processing chip MCU B. When the circuit structure is applied to the second input sampling circuit, the other end of the fifth resistor is connected to the second sampling end, and the output end of the inverter is connected to the third pin of the first processing chip MCU A and the thirteenth pin of the second processing chip MCU B. When the circuit structure is applied to the third input sampling circuit, the other end of the fifth resistor is connected to the third sampling end, and the output end of the inverter is connected to the fourth pin of the first processing chip MCU A and the fourteenth pin of the second processing chip MCU B.

In an embodiment of this disclosure, the first diagnostic signal generation circuit and the second diagnostic signal generation circuit have the same circuit structure, and the circuit structure comprises: an eighth resistor, a ninth resistor, a tenth resistor, an eleventh resistor, a second NPN-type transistor, a third NPN-type transistor, a second PNP-type transistor, a second voltage regulator tube, a first capacitor, and a second capacitor. One end of the eighth resistor is connected to one end of the ninth resistor and a base of the second NPN-type transistor. The other end of the ninth resistor is connected to an emitter of the second NPN-type transistor. A collector of the second NPN-type transistor is connected to one end of the tenth resistor and one end of the eleventh resistor. The other end of the tenth resistor is connected to a power supply. The other end of the eleventh resistor is connected to a base of the third NPN-type transistor and a base of the second PNP-type transistor. An emitter of the third NPN-type transistor is connected to an emitter of the second PNP-type transistor and one end of the first capacitor. A collector of the third NPN-type transistor is connected to the power supply. A collector of the second PNP-type transistor is connected to a positive electrode of the second voltage regulator tube and is grounded. The other end of the first capacitor is connected to one end of the second capacitor. When the circuit structure is applied to the first diagnostic signal generation circuit, the other end of the eighth resistor is connected to the seventh pin of the MCU A, and the other end of the second capacitor is connected to the first normally closed contact. When the circuit structure is applied to the second diagnostic signal generation circuit, the other end of the eighth resistor is connected to the seventeenth pin of the MCU B, and the other end of the second capacitor is connected to the second normally closed contact.

In an embodiment of this disclosure, the diagnostic signal detection circuit comprises: a twelfth resistor, a thirteenth resistor, a fourteenth resistor, a fifteenth resistor, a third capacitor, a fourth capacitor, a fifth capacitor, a third voltage regulator tube, and a fourth NPN-type transistor. One end of the twelfth resistor is connected to the eighth pin of the first processing chip MCU A and the eighteenth pin of the second processing chip MCU B. The other end of the twelfth resistor is connected to one end of the thirteenth resistor and a collector of the fourth NPN-type transistor. The other end of the thirteenth resistor is connected to a power supply. A base of the fourth NPN-type transistor is connected to one end of the fourteenth resistor, one end of the third capacitor, and one end of the fifteenth resistor. The other end of the fifteenth resistor is connected to a negative electrode of the third voltage regulator tube and one end of the fourth capacitor. The other end of the fourth capacitor is connected to one end of the fifth capacitor. The other end of the fifth capacitor is connected to the first common contact and the second common contact. An emitter of the fourth NPN-type transistor, the other end of the fourteenth resistor, the other end of the third capacitor, and a positive electrode of the third voltage regulator tube are grounded.

In an embodiment of this disclosure, the first processing chip MCU A and the second processing chip MCU B are configured to, when external output of the first relay output end and the second relay output end of the intelligent relay needs to be started, cause the first relay driving circuit to drive the coil of the first relay circuit to be powered on so that the first common contact is connected to the first normally open contact, and cause the second relay driving circuit to drive the coil of the second relay circuit to be powered on so that the second common contact is connected to the second normally open contact. If the pin of the first processing chip MCU A or the second processing chip MCU B receives a high-level output from the diagnostic signal detection circuit, it indicates that the first relay circuit or the second relay circuit does not have a contact adhesion fault. If the pin of the first processing chip MCU A or the second processing chip MCU B receives a low-level output from the diagnostic signal detection circuit, it indicates that the first relay circuit or the second relay circuit has an adhesion fault among the common contact, the normally open contact, and the normally closed contact.

And/or, the first processing chip MCU A and the second processing chip MCU B are configured to, when external output of the first relay output end and the second relay output end of the intelligent relay needs to be turned off, cause the first relay driving circuit to drive the coil of the first relay circuit to be powered off so that the first common contact is connected to the first normally closed contact, and cause the second relay driving circuit to drive the coil of the second relay circuit to be powered off so that the second common contact is connected to the second normally closed contact. If the pin of the first processing chip MCU A or the second processing chip MCU B receives a low-level output from the diagnostic signal detection circuit, it indicates that the first relay circuit or the second relay circuit does not have a contact adhesion fault. If the pin of the first processing chip MCU A or the second processing chip MCU B receives a high-level output from the diagnostic signal detection circuit, it indicates that the first relay circuit or the second relay circuit has an adhesion fault between the common contact and the normally open contact.

In an embodiment of this disclosure, the intelligent safety relay comprises: a power input end, configured to receive external direct-current power supply; a voltage regulation circuit, having an input end connected to the power input end and an output end that leads out a first direct-current power supply end to provide a first direct-current power supply VCC1; and a voltage-stabilizing filter circuit, having an input end connected to the output end of the voltage regulation circuit and an output end that leads out a second direct-current power supply end to provide a second direct-current power supply VCC2 which is originated from the first direct-current power supply and formed through a voltage-stabilizing filter circuit. The first direct-current power supply VCC1 is connected to the first input driving circuit, the second input driving circuit, the first relay driving circuit, and the second relay driving circuit so as to supply power. The second direct-current power supply VCC2 is connected to the first processing chip MCU A, the second processing chip MCU B, the first logic circuit, the second logic circuit, the first input sampling circuit, the second input sampling circuit, and the third input sampling circuit so as to supply power.

This disclosure provides a relay application circuit, comprising: the intelligent safety relay; an emergency stop switch S1, comprising: two groups of normally closed contacts, which are connected to a circuit between S11 and S12 and a circuit between S21 and S22 respectively; a reset switch S2, comprising: a group of normally open contacts, connected to a circuit between S12 and S34; a power supply, connected in a loop between a first relay output end and a second relay output end; and contactors K3 and K4, connected in parallel in a loop between the first relay output end and the second relay output end so as to be powered on or powered off when the first relay output end and the second relay output end are connected or disconnected. K3 and K4 are connected in power supply circuits of different phases of a motor M respectively, and power-on or power-off of K3 and K4 causes the power supply circuits where K3 and K4 are located to be connected or disconnected, so that the motor M is powered on or powered off.

In an embodiment of this disclosure, the emergency stop switch S1, when not closed, causes the two normally closed contacts thereof to be closed, to make the circuit between S12 and S11 conductive and the circuit between S21 and S22 conductive, so that the intelligent safety relay is in an output ready state. The emergency stop switch S1 is further configured to, when closed, cause the two normally closed contacts to be disconnected, to disconnect the circuit between S12 and S11 and disconnect the circuit between S21 and S22, and trigger a first processing chip MCU A and a second processing chip MCU B to output signals to disconnect the first relay output end from the second relay output end, so that the contactors K3 and K4 are powered off, and the motor M is powered off. The reset switch S2 is configured to, when closed, cause the normally open contact thereof to be closed, to make a circuit between S34 and S11 conductive, and trigger the first processing chip MCU A and the second processing chip MCU B to output signals to make the first relay output end in conduction with the second relay output end, so that the contactors K3 and K4 are powered on, and the motor M is powered on.

As described above, this disclosure provides an intelligent safety relay and a circuit applied thereby. The intelligent safety relay comprises: a first processing chip MCU A, a second processing chip MCU B, first and second input driving circuits, first to third input sampling circuits, first and second diagnostic signal generation circuits, first and second logic circuits, a diagnostic signal detection circuit, first and second relay driving circuits, and first and second relay circuits. The first processing chip MCU A and the second processing chip MCU B can automatically control, based on samples of the input driving circuits taken by the input sampling circuits, connection or disconnection of contacts in the first and second relay circuits so as to switch on or off an output, and can detect various faults according to the diagnostic signal generation circuits and the diagnostic signal detection circuit so as to switch on or off an output, thus implementing intelligent and reliable cutoff. Moreover, the use of the intelligent solution can implement various safety functions or logical requirements by means of configuration.

DETAILED DESCRIPTION OF THE PREFERRED EMBODIMENTS

Implementations of this disclosure are illustrated below through specific embodiments. A person skilled in the art can easily understand other advantages and efficacy of this disclosure according to the content disclosed in this specification. This disclosure can also be implemented or applied through other different specific implementations. Various modifications or variations can also be made on details in this specification based on different opinions and applications without departing from the spirit of this disclosure. It should be noted that, the embodiments in this disclosure and features in the embodiments can be combined with each other if no conflict occurs.

It should be noted that, the figures provided in the following embodiments merely illustrate the basic conception of the present disclosure schematically. Therefore, the figures only show components related to this disclosure, and are not drawn according to the quantity, shapes and sizes of components during actual implementation. The pattern, quantity and ratio of components during actual implementation can be changed arbitrarily, and the component layout may also be more complex.

Conventional safety relay includes:

1) forcibly guided relay: a guide rod is provided between a normally closed contact and a normally open contact of the forcibly guided relay, so that the normally closed contact and the normally open contact can never be both closed. A safety relay can effectively detect closing of a contact, to ensure safety. However, because the forcibly guided relay has high costs and a large volume, forcibly guided relay generally requires high costs, and is difficult to be miniaturized.

2) relay based on semiconductor switch: an output of a semiconductor may be connected in series, and then a state of the semiconductor is detected by using a voltage feedback. The semiconductor switch can be made small, and the costs thereof can also be reduced. However, a safety relay based on semiconductor switch can only be used for cutting off direct-current load, and the load needs to have a common-ground point with the safety relay. As a result, applications of the safety relay are limited. For example, the safety relay is inapplicable to alternating-current load or an isolation requirement.

Figure 1:
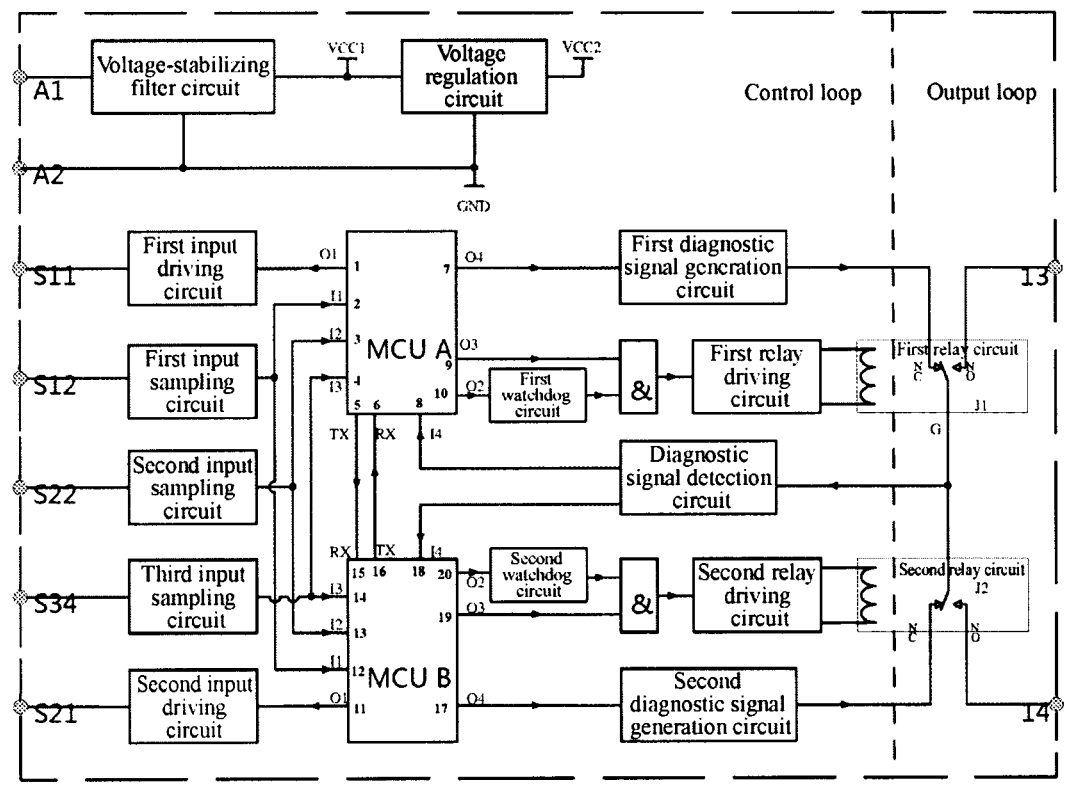
FIG. 1 is a schematic diagram of circuit modules of an intelligent relay according to an embodiment of this disclosure.

FIG. 1 is a schematic diagram of a circuit of an intelligent safety relay according to an embodiment of this disclosure. The intelligent safety relay includes: a first processing chip MCU A, a second processing chip MCU B, a first input driving circuit, a second input driving circuit, a first input sampling circuit, a second input sampling circuit, a third input sampling circuit, a first diagnostic signal generation circuit, a second diagnostic signal generation circuit, a diagnostic signal detection circuit, a first logic circuit, a second logic circuit, a first relay driving circuit, a second relay driving circuit, a first driver circuit, and a second driver circuit.

The first processing chip MCU A includes: first pin to tenth pin (represented by pins 1 to 10 in the MCU A in the figure).

The second processing chip MCU B includes: an eleventh pin O1 to a twentieth pin O2 (represented by pins 11 to 20 in the MCU B in the figure).

The first input driving circuit has an input end connected to the first pin O1 of the first processing chip MCU A and an output end that leads out a first control end S11.

The second input driving circuit has an input end connected to the eleventh pin O1 of the second processing chip MCU B, and an output end that leads out a second control end S21. The first control end S11 and the second control end S21 output a first driving signal and a second driving signal respectively. The first driving signal and the second driving signal are periodic pulse signals having different waveforms.

The first input sampling circuit has an input end connected to a first sampling end S12 and an output end connected to the second pin of the first processing chip MCU A and the twelfth pin of the second processing chip MCU B, so as to separately output a sampling signal I1. The second input sampling circuit has an input end connected to a second sampling end S22 and an output end connected to the third pin of the first processing chip MCU A and the thirteenth pin of the second processing chip MCU B, so as to separately output a sampling signal 12. The third input sampling circuit has an input end connected to a second sampling end S34 and an output end connected to the fourth pin of the first processing chip MCU A and the fourteenth pin of the second processing chip MCU B, so as to separately output a sampling signal 13.

Specifically, some of the first sampling end S12, the second sampling end S22, and the third sampling end S34 are coupled to S11 and the rest is coupled to the S21, so as to sample signals. When information is sampled, a sampling signal recognizable to the first processing chip MCU A is generated and inputted to the first processing chip MCU A, and a sampling signal recognizable to the second processing chip MCU B is generated and inputted to the second processing chip MCU B, so that the first processing chip MCU A and the second processing chip MCU B, when receiving the sampling signal, control the intelligent safety relay to stay in an output ready state.

S11 and S21 generate two different waveforms. The different waveforms are generated to differentiate S11 and S21. When a wiring error or a short-circuit occurs, S11 and S21 can be differentiated. It should be noted that, during design of waveforms, S11 and S21 cannot be low level at the same time.

The fifth pin TX of the first processing chip MCU A is connected to the fifteenth pin RX of the second processing chip MCU B to form a first data channel. The fifth pin TX is a data transmitting end, and the fifteenth pin RX is a data receiving end. The sixth pin RX of the first processing chip MCU A is connected to the sixteenth pin TX of the second processing chip MCU B to form a second data channel. The sixth pin is a data receiving end RX, and the sixteenth pin is a data transmitting end TX. Data transmission or clock synchronization is performed between the first processing chip MCU A and the second processing chip MCU B through the first data channel and the second data channel.

The seventh pin O4 of the first processing chip MCU A is connected to an input end of the first diagnostic signal generation circuit. The seventeenth pin O4 of the second processing chip MCU B is connected to an input end of the second diagnostic signal generation circuit.

The diagnostic signal detection circuit has a first output end connected to the eighth pin I4 of the first processing chip MCU A, a second output end connected to the eighteenth pin I4 of the second processing chip MCU B, and an input end. The first logic circuit has a first input end connected to the ninth pin O3 of the first processing chip MCU A, a second input end connected to the tenth pin O2 of the first processing chip MCU A, and an output end connected to an input end of the first relay driving circuit.

An output end of the first relay driving circuit is connected to a first relay coil of a first relay circuit. The first relay circuit further includes: a first normally closed contact NC connected to an output end of the first diagnostic signal generation circuit, a first normally open contact NO connected to a first relay output end 13, and a first common contact G connected to the input end of the diagnostic signal detection circuit. The first logic circuit obtains a first on-off control signal by performing a logical operation according to input signals at the ninth pin O3 and the tenth pin O2 of the first processing chip MCU A, so that the first relay driving circuit drives the first relay coil to be powered on or powered off, the first common contact G is electrically connected to the first normally closed contact NC or the first normally open contact NO. The second logic circuit has a first input end connected to the nineteenth pin O3 of the second processing chip MCU B, a second input end connected to the twentieth pin O2 of the second processing chip MCU B, and an output end connected to the input end of the second relay driving circuit 14. An output end of the second relay driving circuit is connected to a second relay coil of a second relay circuit. The second relay circuit further includes: a second normally closed contact NC connected to an output end of the second diagnostic signal generation circuit, a second normally open contact NO connected to a second relay output end, and a second common contact G connected to the input end of the diagnostic signal detection circuit and the first common contact G. The second logic circuit obtains a second on-off control signal by performing a logical operation according to input signals at the nineteenth pin O3 and the twentieth pin O2 of the second processing chip MCU B, so that the second relay driving circuit drives the second relay coil to be powered on or powered off, the second common contact G is electrically connected to the second normally closed contact NC or the second normally open contact NO. The electric connection between the first common contact G and the first normally open contact NO, and the electric connection between the second common contact G and the second normally open contact NO conduct the first relay output end 13 with the second relay output end.

The first relay circuit and the second relay circuit each may use a general relay having a group of conversion contacts. This type of relay can be small. When a general relay is used, whether a contact fault of the general relay can be effectively identified needs to be considered, and this function is achieved by the foregoing diagnostic signal generation circuits and diagnostic signal detection circuit. In addition, isolation is frequently used. Therefore, isolation between a control loop and an output loop in FIG. 1 needs to be considered. Isolation can be implemented by using high-voltage low-capacitance capacitors, which are connected to the output loop, in the diagnostic signal generation circuits and the diagnostic signal detection circuit.

In an embodiment of this disclosure, the first logic circuit includes: a first AND gate which includes a first input end, a second input end, and an output end, and a first watchdog circuit. The first input end of the first AND gate is connected to the ninth pin O3 of the first processing chip MCU A. The tenth pin O2 of the first processing chip MCU A is connected to an input end of the first watchdog circuit. An output end of the first watchdog circuit is connected to the second input end of the first AND gate. The output end of the first AND gate is connected to the input end of the first relay driving circuit. The second logic circuit includes: a second AND gate which includes a first input end, a second input end, and an output end, and a second watchdog circuit. The first input end of the second AND gate is connected to the nineteenth pin O3 of the second processing chip MCU B, the twentieth pin O2 of the second processing chip MCU B is connected to an input end of the second watchdog circuit, and an output end of the second watchdog circuit is connected to the second input end of the second AND gate. The output end of the first AND gate is connected to the input end of the first relay driving circuit.

In an embodiment of this disclosure, the first processing chip MCU A is configured to periodically output, through the tenth pin O2 thereof, a pulse signal to the first watchdog circuit. The first watchdog circuit is configured to output a low-level signal in case that the pulse signal is not received within a predetermined time period, so that the output end of the first AND gate outputs a low-level signal, the first relay driving circuit outputs a low level, the first relay coil is powered off, therefore the first common contact G of a first switch is disconnected from the first normally open contact NO, and connects the first normally close contact NC. The second processing chip MCU B is configured to periodically output, through the twentieth pin O2 thereof, a pulse signal to the second watchdog circuit. The second watchdog circuit is configured to output a low-level signal in case that the pulse signal is not received within a predetermined time period, so that the output end of the second AND gate outputs a low-level signal, the second relay driving circuit outputs a low level, and the second relay coil is powered off, and therefore the second common contact G of a second switch is disconnected from the second normally open contact NO, and is connected to the first normally closed contact NC. The watchdog circuit is used to prevent the intelligent safety relay from being in an unsafe state due to an MCU failure or software fleeting.

In an embodiment of this disclosure, the intelligent safety relay includes: a power input end, configured to receive external direct-current power supply (such as a 24V direct-current power supply); a voltage regulation circuit, having an input end connected to the power input end and an output end that leads out a first direct-current power supply end to provide a first direct-current power supply VCC1; and a voltage-stabilizing filter circuit. The voltage-stabilizing filter circuit has an input end connected to the output end of the voltage regulation circuit and an output end. The output end of the voltage-stabilizing filter circuit leads out a second direct-current power supply end to provide a second direct-current power supply VCC2 which is formed after the first direct-current power supply passing through the voltage-stabilizing filter circuit. The first direct-current power supply VCC1 is connected to the first input driving circuit, the second input driving circuit, the first relay driving circuit, and the second relay driving circuit so as to supply power. The second direct-current power supply VCC2 is connected to the first processing chip MCU A, the second processing chip MCU B, the first logic circuit, the second logic circuit, the first input sampling circuit, the second input sampling circuit, and the third input sampling circuit so as to supply power. The voltage-stabilizing filter circuit and the voltage regulation circuit may be implemented in many manners. The technology has been mature, and details are not described specifically.

Figure 2:
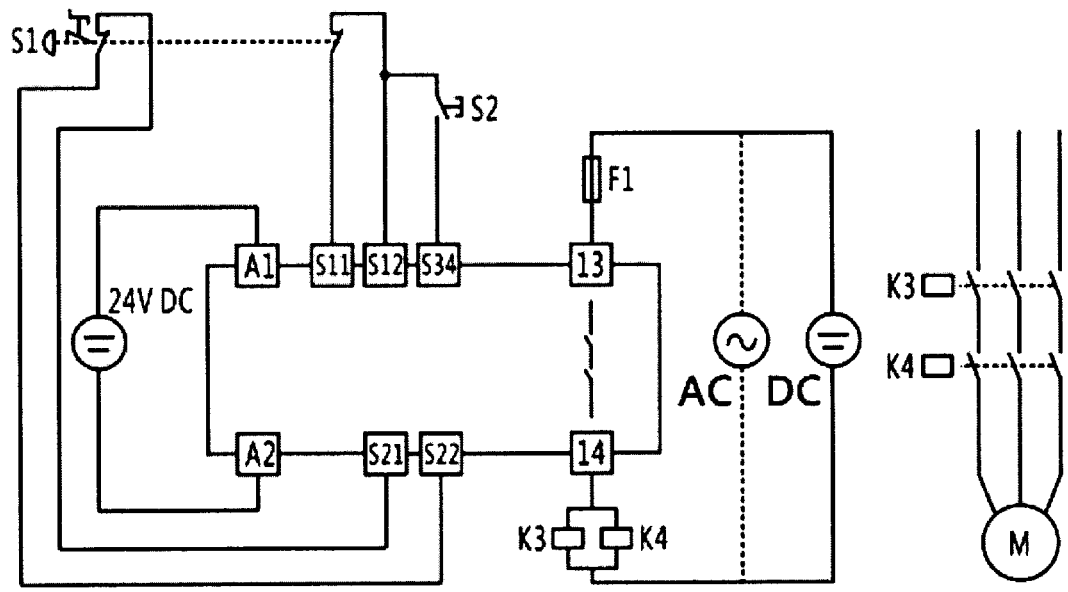
FIG. 2 is a schematic diagram of a circuit an intelligent relay is applied in an embodiment according to this disclosure.

FIG. 2 is a schematic diagram of a circuit the intelligent safety relay in FIG. 1 is applied in an embodiment.

The circuit includes: the intelligent safety relay, an emergency stop switch S1, a reset switch S2, power supply, contactors K3, K4, and the like. The emergency stop switch S1 includes: two groups of normally closed contacts, which are connected to a circuit between S11 and S12, and a circuit between S21 and S22 respectively. The reset switch S2 includes: a group of normally open contacts, connected to a circuit between S12 and S34. The power supply is connected in a loop between the first relay output end 13 and the second relay output end 14. Contactors K3 and K4 are connected in parallel in a loop between the first relay output end 13 and the second relay output end 14, so as to be powered on or powered off when the first relay output end 13 and the second relay output end 14 are connected or disconnected. K3 and K4 are connected in power supply circuits of different phases of a motor M respectively, and power-on or power-off of K3 and K4 causes the power supply circuits where K3 and K4 are located to be connected or disconnected, so that the motor M is powered on or powered off.

In an embodiment of this disclosure, the emergency stop switch S1, when not closed, causes the two normally closed contacts thereof to be closed, to make the circuit between S12 and S11 conductive and the circuit between S21 and S22 conductive, so that the intelligent safety relay is in an output ready state. The emergency stop switch S1 is further configured to, when closed, cause the two normally closed contacts to be disconnected, to disconnect the circuit between S12 and S11 and disconnect the circuit between S21 and S22, and trigger the first processing chip MCU A and the second processing chip MCU B to output signals to disconnect the first relay output end from the second relay output end, so that the contactors K3 and K4 are powered off, and the motor M is powered off, to ensure safety. The reset switch S2 is configured to, when closed, cause the normally open contact thereof to be closed, to make a circuit between S34 and S11 conductive, and trigger the first processing chip MCU A and the second processing chip MCU B to output signals to make the first relay output end in conduction with the second relay output end, so that the contactors K3 and K4 are powered on, and the motor M is powered on to start operating.

It should be noted that, although in the embodiment in FIG. 2, S12 corresponds to signal sampling of S11 and S34, and S22 corresponds to signal sampling of S21, the relationship of the sampling may be changed in other embodiments, and is not limited thereto.

In an embodiment of this disclosure, the input driving circuits may be implemented by using transistors, high side switches, or the like.

Specifically, the input driving circuits are implemented by using transistors. The first input driving circuit and the second input driving circuit may have the same circuit. The circuit includes: a first PNP-type transistor, a first NPN-type transistor, a first resistor, a second resistor, a third resistor, and a fourth resistor. An emitter of the first PNP-type transistor is connected to a power supply, a base of the first PNP-type transistor is connected to a collector of the first NPN-type transistor through the first resistor, and a collector of the first PNP-type transistor is grounded through the second resistor. The collector of the first NPN-type transistor is grounded, a base of the first NPN-type transistor is connected to one end of the third resistor and one end of the fourth resistor, and the other end of the third resistor is grounded. When the circuit structure is applied to the first input driving circuit, the collector of the first PNP-type transistor is led out to the first control end S11; and the other end of the fourth resistor is connected to the first pin O1 of the first processing chip MCU A. When the circuit structure is applied to the second input driving circuit, the collector of the first PNP-type transistor is led out to the second control end S21; and the other end of the fourth resistor is connected to the eleventh pin O1 of the second processing chip MCU B.

In an embodiment of this disclosure, the first input sampling circuit, the second input sampling circuit, and the third input sampling circuit are each implemented by resistive subdivision or a logic control element, and the logic control element includes: an operational amplifier or an inverter.

Specifically, the first input sampling circuit, the second input sampling circuit, and the third input sampling circuit have the same circuit. The circuit includes: an inverter, a first voltage regulator tube, a fifth resistor, a sixth resistor, and a seventh resistor. One end of the fifth resistor is connected to one end of the sixth resistor and one end of the seventh resistor, the other end of the sixth resistor is grounded, the other end of the seventh resistor is connected to a negative electrode of the first voltage regulator tube and an input end of the inverter. A positive electrode of the first voltage regulator tube is grounded. When the circuit is applied to the first input sampling circuit, the other end of the fifth resistor is connected to the first sampling end, and an output end of the inverter is connected to the second pin I1 of the first processing chip MCU A and the twelfth pin I1 of the second processing chip MCU B. When the circuit is applied to the second input sampling circuit, the other end of the fifth resistor is connected to the second sampling end, and the output end of the inverter is connected to the third pin I2 of the first processing chip MCU A and the thirteenth pin I2 of the second processing chip MCU B. When the circuit structure is applied to the third input sampling circuit, the other end of the fifth resistor is connected to the third sampling end, and the output end of the inverter is connected to the fourth pin I3 of the first processing chip MCU A and the fourteenth pin I3 of the second processing chip MCU B.

Figure 3A:
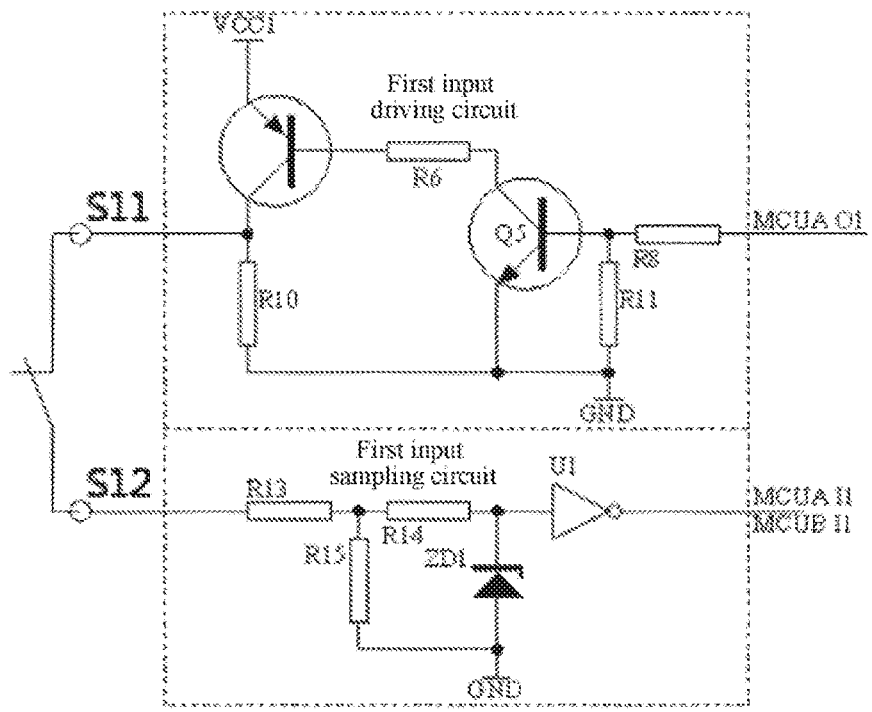
FIG. 3A is a schematic diagram of a circuit connecting an input driving circuit and an input sampling circuit according to an embodiment of this disclosure.
Figure 3B:
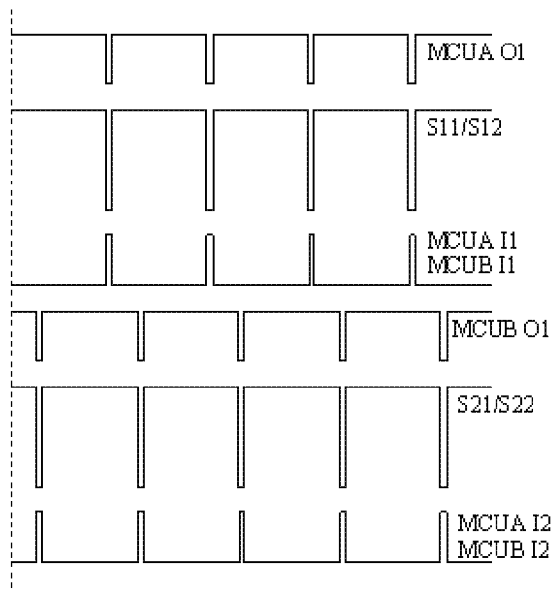
FIG. 3B is a schematic sequence diagram of signals in the embodiment in FIG. 3A.

FIG. 3A is a schematic diagram of a circuit connecting a first input driving circuit and a first input sampling circuit according to an embodiment of this disclosure. FIG. 3B is a waveform sequence diagram of related ports and pins in this embodiment.

In an embodiment of this disclosure, the first diagnostic signal generation circuit and the second diagnostic signal generation circuit have the same circuit. The circuit includes: an eighth resistor, a ninth resistor, a tenth resistor, an eleventh resistor, a second NPN-type transistor, a third NPN-type transistor, a second PNP-type transistor, a second voltage regulator tube, a first capacitor, and a second capacitor. One end of the eighth resistor is connected to one end of the ninth resistor and a base of the second NPN-type transistor. The other end of the ninth resistor is connected to an emitter of the second NPN-type transistor. A collector of the second NPN-type transistor is connected to one end of the tenth resistor and one end of the eleventh resistor. The other end of the tenth resistor is connected to a power supply (direct-current power supply). The other end of the eleventh resistor is connected to a base of the third NPN-type transistor and a base of the second PNP-type transistor. An emitter of the third NPN-type transistor is connected to an emitter of the second PNP-type transistor and one end of the first capacitor. A collector of the third NPN-type transistor is connected to the power supply. A collector of the second PNP-type transistor is connected to a positive electrode of the second voltage regulator tube and is grounded, and the other end of the first capacitor is connected to one end of the second capacitor. When the circuit structure is applied to the first diagnostic signal generation circuit, the other end of the eighth resistor is connected to the seventh pin of the MCU A, and the other end of the second capacitor is connected to the first normally closed contact. When the circuit structure is applied to the second diagnostic signal generation circuit, the other end of the eighth resistor is connected to the seventeenth pin of the MCU B, and the other end of the second capacitor is connected to the second normally closed contact.

In an embodiment of this disclosure, the diagnostic signal detection circuit comprises: a twelfth resistor, a thirteenth resistor, a fourteenth resistor, a fifteenth resistor, a third capacitor, a fourth capacitor, a fifth capacitor, a third voltage regulator tube, and a fourth NPN-type transistor. One end of the twelfth resistor is connected to the eighth pin I4 of the first processing chip MCU A and the eighteenth pin I4 of the second processing chip MCU B. The other end of the twelfth resistor is connected to one end of the thirteenth resistor and a collector of the fourth NPN-type transistor. The other end of the thirteenth resistor is connected to a power supply. A base of the fourth NPN-type transistor is connected to one end of the fourteenth resistor, one end of the third capacitor, and one end of the fifteenth resistor. The other end of the fifteenth resistor is connected to a negative electrode of the third voltage regulator tube and one end of the fourth capacitor. The other end of the fourth capacitor is connected to one end of the fifth capacitor. The other end of the fifth capacitor is connected to the first common contact and the second common contact. An emitter of the fourth NPN-type transistor, the other end of the fourteenth resistor, the other end of the third capacitor, and a positive electrode of the third voltage regulator tube are grounded.

Figure 4A:
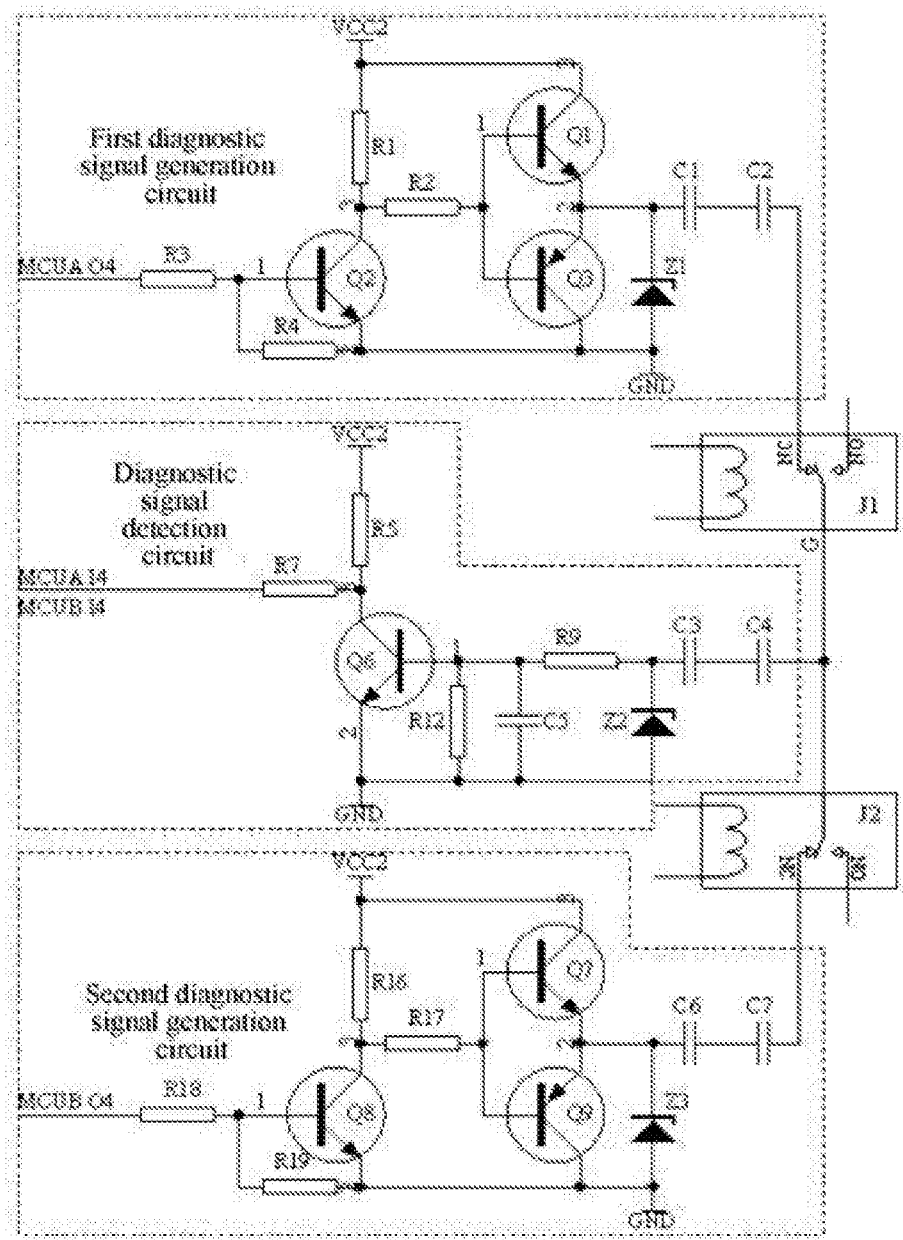
FIG. 4A is a schematic diagram of a circuit connecting a first diagnostic signal generation circuit, a second diagnostic signal generation circuit, and a diagnostic signal sampling circuit according to an embodiment of this disclosure.
Figure 4B:
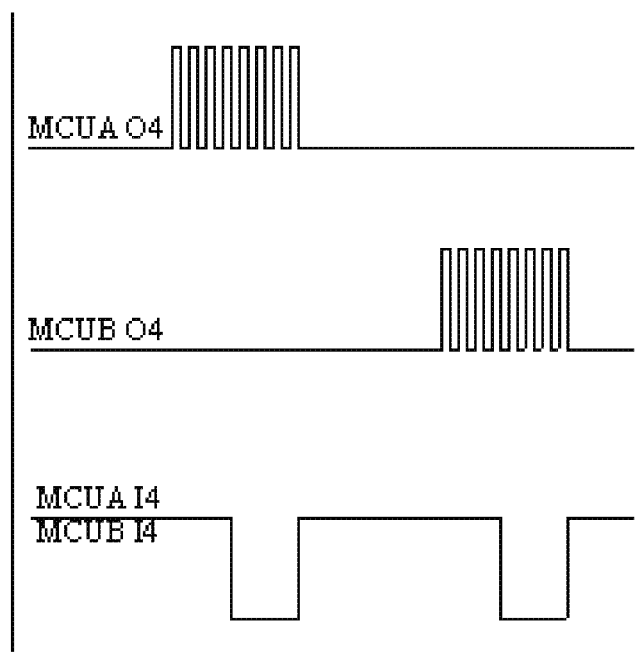
FIG. 4B is a schematic sequence diagram of signals in the embodiment in FIG. 4A.

FIG. 4A is a schematic diagram of a circuit connecting a first diagnostic signal generation circuit, a second diagnostic signal generation circuit, and a diagnostic signal sampling circuit according to an embodiment of the present disclosure. FIG. 4B is a sequence diagram of signals of corresponding ports in the embodiment shown in FIG. 4A.

When the relay does not have a failure, the pin O4 of the MCU generates high-frequency alternating high and low levels. The transistors Q2 and Q3 output high-frequency alternating high-level and low-level signals. The voltage regulator tube Z1 is used for protecting the control loop. The high-frequency alternating high-level and low-level signals may be transmitted to C3 and C4 of the diagnostic detection circuit through C1, C2, and a contact common end of the relay, while the waveform is still high-frequency alternating high and low levels. Then, through R9 and C5 filtering circuit, the signal becomes a stable control voltage. The voltage con control Q6 to be conductive. The diagnostic detection circuit detects 14 at a low level and transmits it to the eighth pin of the MCU A and the eighteenth pin of the MCU B.

Moreover, the control loop and the output loop can be effectively isolated by using the high-voltage low-capacitance capacitors C1, C2, C3, C4, C6, and C7. The control loop and the safety loop can be effectively isolated by using an isolation effect of the capacitors, thus ensuring isolation.

Contact fault detection is specifically described. faults in the relay include: contact adhesion between the common contact G and the normally open contact NO of the relay; and adhesion among three ends of the relay, that is, the common contact G, the normally closed contact NC, and the normally open contact NO.

In an embodiment of this disclosure, the first processing chip MCU A and the second processing chip MCU B are configured to, when external output of the first relay output end 13 and the second relay output end 14 of the intelligent relay needs to be started, cause the first relay driving circuit to drive the coil of the first relay circuit to be powered on so that the first common contact is connected to the first normally open contact, and cause the second relay driving circuit to drive the coil of the second relay circuit to be powered on so that the second common contact is connected to the second normally open contact. If the pin I4 of the first processing chip MCU A or the second processing chip MCU B receives a high-level output from the diagnostic signal detection circuit, it indicates that the first relay circuit or the second relay circuit does not have a contact adhesion fault. If the pin I4 of the first processing chip MCU A or the second processing chip MCU B receives a low-level output from the diagnostic signal detection circuit, it indicates that the first relay circuit or the second relay circuit has an adhesion fault among the common contact, the normally open contact, and the normally closed contact.

And/or, the first processing chip MCU A and the second processing chip MCU B are configured to, when external output of the first relay output end and the second relay output end of the intelligent relay needs to be turned off, cause the first relay driving circuit to drive the coil of the first relay circuit to be powered off so that the first common contact is connected to the first normally closed contact, and cause the second relay driving circuit to drive the coil of the second relay circuit to be powered off so that the second common contact is connected to the second normally closed contact. If the pin I4 of the first processing chip MCU A or the second processing chip MCU B receives a low-level output from the diagnostic signal detection circuit, it indicates that the first relay circuit or the second relay circuit does not have a contact adhesion fault. If the pin I4 of the first processing chip MCU A or the second processing chip MCU B receives a high-level output from the diagnostic signal detection circuit, it indicates that the first relay circuit or the second relay circuit has an adhesion fault between the common contact and the normally open contact.

In conclusion, this disclosure provides an intelligent safety relay and a circuit applied thereby. The intelligent safety relay includes: a first processing chip MCU A, a second processing chip MCU B, first and second input driving circuits, first to third input sampling circuits, first and second diagnostic signal generation circuits, first and second logic circuits, a diagnostic signal detection circuit, first and second relay driving circuits, and first and second relay circuits. The first processing chip MCU A and the second processing chip MCU B can automatically control, based on samples of the input driving circuits taken by the input sampling circuits, connection or disconnection of contacts in the first and second relay circuits so as to switch on or off an output, and can detect various faults according to the diagnostic signal generation circuits and the diagnostic signal detection circuit so as to switch on or off an output, thus implementing intelligent and reliable cutoff. Moreover, the use of the intelligent solution can implement various safety functions or logical requirements by means of configuration.

Therefore, this disclosure effectively overcomes various disadvantages in the prior art and achieves high industrial application value.

The foregoing embodiments are only used to illustrate the principle and efficacy of this disclosure exemplarily, and are not intended to limit this disclosure. Any person skilled in the art can make modifications or variations on the foregoing embodiments without departing from the spirit and scope of this disclosure. Accordingly, all equivalent modifications or variations completed by those with common knowledge in the art without departing from the spirit and technical thinking disclosed by this disclosure should fall within the scope of the claims of this disclosure.

What is claimed is:

1. An intelligent safety relay, comprising:
   a first processing chip MCU A, comprising: first to tenth pins; and a second processing chip MCU B, comprising: eleventh to twentieth pins;
   a first input driving circuit, having an input end connected to the first pin of the first processing chip MCU A and an output end that leads out a first control end S11;
   a second input driving circuit, having an input end connected to the eleventh pin of the second processing chip MCU B and an output end that leads out a second control end S21, wherein the first control end S11 and the second control end S21 output a first driving signal and a second driving signal respectively, the first driving signal and the second driving signal are periodic pulse signals having different waveforms;
   a first input sampling circuit, having an input end connected to a first sampling end S12 and an output end connected to the second pin of the first processing chip MCU A and the twelfth pin of the second processing chip MCU B;
   a second input sampling circuit, having an input end connected to a second sampling end S22 and an output end connected to the third pin of the first processing chip MCU A and the thirteenth pin of the second processing chip MCU B;
   a third input sampling circuit, having an input end connected to a third sampling end S34 and an output end connected to the fourth pin of the first processing chip MCU A and the fourteenth pin of the second processing chip MCU B, wherein part of the first sampling end S12, the second sampling end S22, and the third sampling end S34 are coupled to S11 and the rest is coupled to the S21, so as to sample signals; when information is sampled, a sampling signal recognizable to the first processing chip MCU A is generated and inputted to the first processing chip MCU A, and a sampling signal recognizable to the second processing chip MCU B is generated and inputted to the second processing chip MCU B, so that the first processing chip MCU A and the second processing chip MCU B, when receiving the sampling signal, control the intelligent safety relay to stay in an output ready state;
   wherein the fifth pin of the first processing chip MCU A is connected to the fifteenth pin of the second processing chip MCU B to form a first data channel, the fifth pin is a data transmitting end, and the fifteenth pin is a data receiving end; the sixth pin of the first processing chip MCU A is connected to the sixteenth pin of the second processing chip MCU B to form a second data channel, the sixth pin is a data receiving end, and the sixteenth pin is a data transmitting end; and
   the seventh pin of the first processing chip MCU A is connected to an input end of a first diagnostic signal generation circuit; the seventeenth pin of the second processing chip MCU B is connected to an input end of a second diagnostic signal generation circuit;
   a diagnostic signal detection circuit, having a first output end connected to the eighth pin of the first processing chip MCU A, a second output end connected to the eighteenth pin of the second processing chip MCU B, and an input end;
   a first logic circuit, having a first input end connected to the ninth pin of the first processing chip MCU A, a second input end connected to the tenth pin of the first processing chip MCU A, and an output end connected to an input end of a first relay driving circuit, wherein an output end of the first relay driving circuit is connected to a first relay coil of a first relay circuit, and the first relay circuit further comprising: a first normally closed contact NC connected to an output end of the first diagnostic signal generation circuit, a first normally open contact NO connected to a first relay output end, and a first common contact G connected to the input end of the diagnostic signal detection circuit, wherein the first logic circuit is configured to perform a logical operation according to input signals at the ninth pin and the tenth pin of the first processing chip MCU A, to obtain a first on-off control signal to cause the first relay driving circuit to drive the first relay coil to be powered on or powered off, so that the first common contact G is electrically connected to the first normally closed contact NC or the first normally open contact NO; and a second logic circuit, having a first input end connected to the nineteenth pin of the second processing chip MCU B, a second input end connected to the twentieth pin of the second processing chip MCU B, and an output end connected to an input end of a second relay driving circuit, wherein an output end of the second relay driving circuit is connected to a second relay coil of a second relay circuit, and the second relay circuit further comprising: a second normally closed contact NC connected to an output end of the second diagnostic signal generation circuit, a second normally open contact NO connected to a second relay output end, and a second common contact G connected to the input end of the diagnostic signal detection circuit and the first common contact G, wherein the second logic circuit is configured to perform a logical operation according to input signals at the nineteenth pin and the twentieth pin of the second processing chip MCU B, to obtain a second on-off control signal to cause the second relay driving circuit to drive the second relay coil to be powered on or powered off, so that the second common contact G is electrically connected to the second normally closed contact NC or the second normally open contact NO;

wherein the electric connection between the first common contact G and the first normally open contact NO, and the electric connection between the second common contact G and the second normally open contact NO conduct the first relay output end with the second relay output end.

2. The intelligent safety relay as in claim 1, wherein the first logic circuit comprises: a first AND gate comprising a first input end, a second input end, and a output end; and a first watchdog circuit; the first input end of the first AND gate is connected to the ninth pin of the first processing chip MCU A, the tenth pin of the first processing chip MCU A is connected to an input end of the first watchdog circuit, an output end of the first watchdog circuit is connected to the second input end of the first AND gate, and the output end of the first AND gate is connected to the input end of the first relay driving circuit; and the second logic circuit comprises: a second AND gate comprising a first input end, a second input end, and an output end; and a second watchdog circuit; the first input end of the second AND gate is connected to the nineteenth pin of the second processing chip MCU B, the twentieth pin of the second processing chip MCU B is connected to an input end of the second watchdog circuit, an output end of the second watchdog circuit is connected to the second input end of the second AND gate, and the output end of the first AND gate is connected to the input end of the first relay driving circuit.

3. The intelligent safety relay as in claim 2, wherein the first processing chip MCU A periodically outputs, through the tenth pin, a pulse signal to the first watchdog circuit; the first watchdog circuit outputs a low-level signal in a case that the pulse signal is not received within a predetermined time period, so that the output end of the first AND gate outputs a low-level signal, the first relay driving circuit outputs a low level, the first relay coil is powered off, and therefore the first common contact G of a first switch is disconnected from the first normally open contact NO; and the second processing chip MCU B periodically outputs, through the twentieth pin, a pulse signal to the second watchdog circuit; the second watchdog circuit outputs a low-level signal in a case that the pulse signal is not received within a predetermined time period, so that the output end of the second AND gate outputs a low-level signal, the second relay driving circuit outputs a low level, and the second relay coil is powered off, and therefore the second common contact G of a second switch is disconnected from the second normally open contact NO.

4. The intelligent safety relay as in claim 1, wherein the input driving circuits are implemented by using transistors, high side switches, or MOS transistors.

5. The intelligent safety relay as in claim 4, wherein the input driving circuits are implemented by using transistors; the first input driving circuit and the second input driving circuit have the same circuit, and the circuit comprises: a first PNP-type transistor, a first NPN-type transistor, a first resistor, a second resistor, a third resistor, and a fourth resistor;

an emitter of the first PNP-type transistor is connected to a power supply, a base of the first PNP-type transistor is connected to a collector of the first NPN-type transistor through the first resistor, and a collector of the first PNP-type transistor is grounded through the second resistor; the collector of the first NPN-type transistor is grounded, a base of the first NPN-type transistor is connected to one end of the third resistor and one end of the fourth resistor, and the other end of the third resistor is grounded;

when the circuit structure is applied to the first input driving circuit, the collector of the first PNP-type transistor is led out to the first control end S11; and the other end of the fourth resistor is connected to the first pin of the first processing chip MCU A; and when the circuit structure is applied to the second input driving circuit, the collector of the first PNP-type transistor is led out to the second control end S21; and the other end of the fourth resistor is connected to the eleventh pin of the second processing chip MCU B.

6. The intelligent safety relay as in claim 1, wherein the first input sampling circuit, the second input sampling circuit, and the third input sampling circuit are each implemented by means of resistive subdivision or a logic control element, and the logic control element comprises: an operational amplifier or an inverter.

7. The intelligent safety relay as in claim 6, wherein the first input sampling circuit, the second input sampling circuit, and the third input sampling circuit have the same circuit, and the circuit comprises: an inverter, a first voltage regulator tube, a fifth resistor, a sixth resistor, and a seventh resistor;

one end of the fifth resistor is connected to one end of the sixth resistor and one end of the seventh resistor, the other end of the sixth resistor is grounded, the other end of the seventh resistor is connected to a negative electrode of the first voltage regulator tube and an input end of the inverter, and a positive electrode of the first voltage regulator tube is grounded; and when the circuit structure is applied to the first input sampling circuit, the other end of the fifth resistor is connected to the first sampling end, and an output end of the inverter is connected to the second pin of the first processing chip MCU A and the twelfth pin of the second processing chip MCU B;

when the circuit structure is applied to the second input sampling circuit, the other end of the fifth resistor is connected to the second sampling end, and the output end of the inverter is connected to the third pin of the first processing chip MCU A and the thirteenth pin of the second processing chip MCU B;

when the circuit structure is applied to the third input sampling circuit, the other end of the fifth resistor is connected to the third sampling end, and the output end of the inverter is connected to the fourth pin of the first processing chip MCU A and the fourteenth pin of the second processing chip MCU B.

8. The intelligent safety relay as in claim 1, wherein the first diagnostic signal generation circuit and the second diagnostic signal generation circuit have the same circuit, and the circuit comprises: an eighth resistor, a ninth resistor, a tenth resistor, an eleventh resistor, a second NPN-type transistor, a third NPN-type transistor, a second PNP-type transistor, a second voltage regulator tube, a first capacitor, and a second capacitor;

one end of the eighth resistor is connected to one end of the ninth resistor and a base of the second NPN-type transistor, the other end of the ninth resistor is connected to an emitter of the second NPN-type transistor, a collector of the second NPN-type transistor is connected to one end of the tenth resistor and one end of the eleventh resistor, the other end of the tenth resistor is connected to a power supply, the other end of the eleventh resistor is connected to a base of the third NPN-type transistor and a base of the second PNP-type transistor, an emitter of the third NPN-type transistor is connected to an emitter of the second PNP-type transistor and one end of the first capacitor, a collector of the third NPN-type transistor is connected to the power supply, a collector of the second PNP-type transistor is connected to a positive electrode of the second voltage regulator tube and is grounded, and the other end of the first capacitor is connected to one end of the second capacitor;

when the circuit structure is applied to the first diagnostic signal generation circuit, the other end of the eighth resistor is connected to the seventh pin of the MCU A, and the other end of the second capacitor is connected to the first normally closed contact; and when the circuit structure is applied to the second diagnostic signal generation circuit, the other end of the eighth resistor is connected to the seventeenth pin of the MCU B, and the other end of the second capacitor is connected to the second normally closed contact.

9. The intelligent safety relay as in claim 1, wherein the diagnostic signal detection circuit comprises: a twelfth resistor, a thirteenth resistor, a fourteenth resistor, a fifteenth resistor, a third capacitor, a fourth capacitor, a fifth capacitor, a third voltage regulator tube, and a fourth NPN-type transistor; and one end of the twelfth resistor is connected to the eighth pin of the first processing chip MCU A and the eighteenth pin of the second processing chip MCU B, the other end of the twelfth resistor is connected to one end of the thirteenth resistor and a collector of the fourth NPN-type transistor, the other end of the thirteenth resistor is connected to a power supply, a base of the fourth NPN-type transistor is connected to one end of the fourteenth resistor, one end of the third capacitor, and one end of the fifteenth resistor, the other end of the fifteenth resistor is connected to a negative electrode of the third voltage regulator tube and one end of the fourth capacitor, the other end of the fourth capacitor is connected to one end of the fifth capacitor, the other end of the fifth capacitor is connected to the first common contact and the second common contact; an emitter of the fourth NPN-type transistor, the other end of the fourteenth resistor, the other end of the third capacitor, and a positive electrode of the third voltage regulator tube are grounded.

10. The intelligent safety relay as in claim 1, wherein the first processing chip MCU A and the second processing chip MCU B, when external output of the first relay output end and the second relay output end of the intelligent relay needs to be started, cause the first relay driving circuit to drive the coil of the first relay circuit to be powered on so that the first common contact is connected to the first normally open contact, and cause the second relay driving circuit to drive the coil of the second relay circuit to be powered on so that the second common contact is connected to the second normally open contact, wherein if the pin of the first processing chip MCU A or the second processing chip MCU B receives a high-level output from the diagnostic signal detection circuit, it indicates that the first relay circuit or the second relay circuit does not have a contact adhesion fault;

if the pin of the first processing chip MCU A or the second processing chip MCU B receives a low-level output from the diagnostic signal detection circuit, it indicates that the first relay circuit or the second relay circuit has an adhesion fault among the common contact, the normally open contact, and the normally closed contact;

and/or the first processing chip MCU A and the second processing chip MCU B, when external output of the first relay output end and the second relay output end of the intelligent relay needs to be turned off, cause the first relay driving circuit to drive the coil of the first relay circuit to be powered off so that the first common contact is connected to the first normally closed contact, and cause the second relay driving circuit to drive the coil of the second relay circuit to be powered off so that the second common contact is connected to the second normally closed contact, wherein if the pin of the first processing chip MCU A or the second processing chip MCU B receives a low-level output from the diagnostic signal detection circuit, it indicates that the first relay circuit or the second relay circuit does not have a contact adhesion fault; if the pin of the first processing chip MCU A or the second processing chip MCU B receives a high-level output from the diagnostic signal detection circuit, it indicates that the first relay circuit or the second relay circuit has an adhesion fault between the common contact and the normally open contact.

11. The intelligent safety relay as in claim 1, comprising: a power input end, receives external direct-current power supply; a voltage regulation circuit, having an input end connected to the power input end and an output end that leads out a first direct-current power supply end to provide a first direct-current power supply VCC1; and a voltage-stabilizing filter circuit, having an input end connected to the output end of the voltage regulation circuit and an output end that leads out a second direct-current power supply end to provide a second direct-current power supply VCC2 which is originated from the first direct-current power supply and formed through a voltage-stabilizing filter circuit;

wherein the first direct-current power supply VCC1 is connected to the first input driving circuit, the second input driving circuit, the first relay driving circuit, and the second relay driving circuit so as to supply power; the second direct-current power supply VCC2 is connected to the first processing chip MCU A, the second processing chip MCU B, the first logic circuit, the second logic circuit, the first input sampling circuit, the second input sampling circuit, and the third input sampling circuit so as to supply power.

12. A relay application circuit, comprising:

an intelligent safety relay, comprising:

a first processing chip MCU A, comprising: first to tenth pins; and a second processing chip MCU B, comprising: eleventh to twentieth pins;

a first input driving circuit, having an input end connected to the first pin of the first processing chip MCU A and an output end that leads out a first control end S11;

a second input driving circuit, having an input end connected to the eleventh pin of the second processing chip MCU B and an output end that leads out a second control end S21, wherein the first control end S11 and the second control end S21 output a first driving signal and a second driving signal respectively, the first driving signal and the second driving signal are periodic pulse signals having different waveforms;

a first input sampling circuit, having an input end connected to a first sampling end S12 and an output end connected to the second pin of the first processing chip MCU A and the twelfth pin of the second processing chip MCU B;

a second input sampling circuit, having an input end connected to a second sampling end S22 and an output end connected to the third pin of the first processing chip MCU A and the thirteenth pin of the second processing chip MCU B;

a third input sampling circuit, having an input end connected to a third sampling end S34 and an output end connected to the fourth pin of the first processing chip MCU A and the fourteenth pin of the second processing chip MCU B, wherein part of the first sampling end S12, the second sampling end S22, and the third sampling end S34 are coupled to S11 and the rest is coupled to the S21, so as to sample signals; when information is sampled, a sampling signal recognizable to the first processing chip MCU A is generated and inputted to the first processing chip MCU A, and a sampling signal recognizable to the second processing chip MCU B is generated and inputted to the second processing chip MCU B, so that the first processing chip MCU A and the second processing chip MCU B, when receiving the sampling signal, control the intelligent safety relay to stay in an output ready state;

wherein the fifth pin of the first processing chip MCU A is connected to the fifteenth pin of the second processing chip MCU B to form a first data channel, the fifth pin is a data transmitting end, and the fifteenth pin is a data receiving end; the sixth pin of the first processing chip MCU A is connected to the sixteenth pin of the second processing chip MCU B to form a second data channel, the sixth pin is a data receiving end, and the sixteenth pin is a data transmitting end; and the seventh pin of the first processing chip MCU A is connected to an input end of a first diagnostic signal generation circuit; the seventeenth pin of the second processing chip MCU B is connected to an input end of a second diagnostic signal generation circuit;

a diagnostic signal detection circuit, having a first output end connected to the eighth pin of the first processing chip MCU A, a second output end connected to the eighteenth pin of the second processing chip MCU B, and an input end;

a first logic circuit, having a first input end connected to the ninth pin of the first processing chip MCU A, a second input end connected to the tenth pin of the first processing chip MCU A, and an output end connected to an input end of a first relay driving circuit, wherein an output end of the first relay driving circuit is connected to a first relay coil of a first relay circuit, and the first relay circuit further comprising: a first normally closed contact NC connected to an output end of the first diagnostic signal generation circuit, a first normally open contact NO connected to a first relay output end, and a first common contact G connected to the input end of the diagnostic signal detection circuit, wherein the first logic circuit is configured to perform a logical operation according to input signals at the ninth pin and the tenth pin of the first processing chip MCU A, to obtain a first on-off control signal to cause the first relay driving circuit to drive the first relay coil to be powered on or powered off, so that the first common contact G is electrically connected to the first normally closed contact NC or the first normally open contact NO; and a second logic circuit, having a first input end connected to the nineteenth pin of the second processing chip MCU B, a second input end connected to the twentieth pin of the second processing chip MCU B, and an output end connected to an input end of a second relay driving circuit, wherein an output end of the second relay driving circuit is connected to a second relay coil of a second relay circuit, and the second relay circuit further comprising: a second normally closed contact NC connected to an output end of the second diagnostic signal generation circuit, a second normally open contact NO connected to a second relay output end, and a second common contact G connected to the input end of the diagnostic signal detection circuit and the first common contact G, wherein the second logic circuit is configured to perform a logical operation according to input signals at the nineteenth pin and the twentieth pin of the second processing chip MCU B, to obtain a second on-off control signal to cause the second relay driving circuit to drive the second relay coil to be powered on or powered off, so that the second common contact G is electrically connected to the second normally closed contact NC or the second normally open contact NO;

wherein the electric connection between the first common contact G and the first normally open contact NO, and the electric connection between the second common contact G and the second normally open contact NO conduct the first relay output end with the second relay output end;

an emergency stop switch S1, comprising: two groups of normally closed contacts, which are connected to a circuit between S11 and S12 and a circuit between S21 and S22 respectively;

a reset switch S2, comprising: a group of normally open contacts, connected to a circuit between S12 and S34;

a power supply, connected in a loop between a first relay output end and a second relay output end; and contactors K3 and K4, connected in parallel in a loop between the first relay output end and the second relay output end so as to be powered on or powered off when the first relay output end and the second relay output end are connected or disconnected, wherein K3 and K4 are connected in power supply circuits of different phases of a motor M respectively, and power-on or power-off of K3 and K4 causes the power supply circuits in which K3 and K4 are located to be connected or disconnected, so that the motor M is powered on or powered off.

13. The relay application circuit as in claim 12, wherein the emergency stop switch S1, when not closed, causes the two normally closed contacts thereof to be closed, to make the circuit between S12 and S11 conductive and the circuit between S21 and S22 conductive, so that the intelligent safety relay is in an output ready state;

the emergency stop switch S1 is further configured to, when closed, cause the two normally closed contacts to be disconnected, to disconnect the circuit between S12 and S11 and disconnect the circuit between S21 and S22, and trigger a first processing chip MCU A and a second processing chip MCU B to output signals to disconnect the first relay output end from the second relay output end, so that the contactors K3 and K4 are powered off, and the motor M is powered off; and the reset switch S2 is configured to, when closed, cause the normally open contact thereof to be closed, to conduct a circuit between S34 and S11, and trigger the first processing chip MCU A and the second processing chip MCU B to output signals to conduct the first relay output end with the second relay output end, so that the contactors K3 and K4 are powered on, and the motor M is powered on.

* * * * *